(12) United States Patent
Vuorela

(10) Patent No.: US 7,170,062 B2
(45) Date of Patent: Jan. 30, 2007

(54) CONDUCTIVE ADHESIVE BONDED SEMICONDUCTOR SUBSTRATES FOR RADIATION IMAGING DEVICES

(75) Inventor: Mikko Ilmari Vuorela, Helsinki (FI)

(73) Assignee: Oy Ajat Ltd., Espoo (FI)

( * ) Notice: Subject to any disclaimer, the term of this patent is extended or adjusted under 35 U.S.C. 154(b) by 195 days.

(21) Appl. No.: 10/400,381

(22) Filed: Mar. 27, 2003

(65) Prior Publication Data

US 2003/0215056 A1 Nov. 20, 2003

Related U.S. Application Data

(60) Provisional application No. 60/368,540, filed on Mar. 29, 2002.

(51) Int. Cl.
- G01T 1/24 (2006.01)
- H01L 27/146 (2006.01)
- H01L 25/065 (2006.01)
- H01L 21/00 (2006.01)

(52) U.S. Cl. .................. 250/370.09; 257/428; 438/57; 438/119

(58) Field of Classification Search ........... 250/370.09; 174/259; 106/286.1; 156/60; 257/E23.023, 257/E27.14, E27.146; 438/119, 610
See application file for complete search history.

(56) References Cited

U.S. PATENT DOCUMENTS

| | | | |
|---|---|---|---|
| 5,043,102 A * | 8/1991 | Chen et al. .................. 252/514 |
| 5,131,582 A | 7/1992 | Kaplan et al. | |
| 5,379,336 A | 1/1995 | Kramer et al. | |
| 5,812,191 A | 9/1998 | Orava et al. | |
| 5,952,646 A | 9/1999 | Spartiotis et al. | |
| 5,965,064 A * | 10/1999 | Yamada et al. ............. 252/512 |
| 6,127,253 A | 10/2000 | Roldan et al. | |
| 6,207,944 B1 * | 3/2001 | Spartiotis et al. ........ 250/208.1 |
| 6,242,746 B1 * | 6/2001 | Teranuma et al. ..... 250/370.13 |

(Continued)

FOREIGN PATENT DOCUMENTS

EP 0 421 869 A1 4/1991

(Continued)

OTHER PUBLICATIONS

Vuorela, M., Holloway, M., Fuchs, S., Stam, F., Kivilahti, J. "Bismuth-filled anisotropically conductive adhesive for flip chip bonding." Proc. of the 4th Int'l Conf. on Adhesive Joining and Coating Technology in Electronics Manufacturing. Jun. 18-21, 2000. pp. 147-152.*

*Primary Examiner*—David Porta
*Assistant Examiner*—Frederick F. Rosenberger
(74) *Attorney, Agent, or Firm*—Moetteli & Associates

(57) ABSTRACT

The radiation detector/imaging substrate arrays in an x-ray and gamma-ray radiation energy imaging device are described which use an electrically conductive adhesive to provide electron charge signaling continuity between the detector and read-out substrates of the device. The present device utilizes a plurality of electrically conductive bonds each discretely connecting a pixel contact in the pixel pattern to a signal contact in the signal contact pattern, the bonds being an electrically conductive adhesive. This bonding technique is especially useful in detection/imaging arrays having detector substrates comprising Cadmium and Tellurium compositions. The present invention is practicable with semiconductor detector and read-out substrates with or without "bumped" electrical contacts. The electrically conductive bonds utilize either isotropically or anisotropically conductive adhesives.

9 Claims, 5 Drawing Sheets

U.S. PATENT DOCUMENTS

| | | | |
|---|---|---|---|
| 6,262,408 B1 * | 7/2001 | Izumi et al. | 250/208.1 |
| 6,340,812 B1 * | 1/2002 | Izumi et al. | 250/208.1 |
| 6,340,818 B1 * | 1/2002 | Izumi et al. | 250/370.13 |
| 6,342,700 B1 * | 1/2002 | Izumi et al. | 250/370.13 |
| 6,392,217 B1 * | 5/2002 | Teranuma et al. | 250/208.1 |
| 6,440,578 B1 | 8/2002 | Shinkai et al. | |
| 6,576,081 B2 * | 6/2003 | Date et al. | 156/310 |
| 6,798,030 B1 * | 9/2004 | Izumi et al. | 257/428 |
| 6,825,473 B2 * | 11/2004 | Watanabe | 250/370.09 |
| 2001/0038075 A1 * | 11/2001 | Morishita | 250/370.08 |

FOREIGN PATENT DOCUMENTS

| | | |
|---|---|---|
| EP | 1 162 833 A1 | 12/2001 |
| JP | 2002181945 A * | 6/2002 |

* cited by examiner

CONDUCTIVE ADHESIVE BONDED SEMICONDUCTOR SUBSTRATES FOR RADIATION IMAGING DEVICES

The present application claims the benefit of prior filed U.S. Provisional Application, Ser. No. 60/368,540, filed 29 Mar. 2002, to which the present application is a non-provisional U.S. Patent Application, and the content of which is incorporated herein by reference.

FIELD OF THE INVENTION

The present invention is in the field of semiconductor devices for detecting invisible radiant energy. More specifically, the present invention relates to imaging systems for forming an image of an object and having detection means including a Cadmium Telluride substrate bonded to a specific semiconductor arrangement using a conductive adhesive.

BACKGROUND OF THE INVENTION

In the field of semiconductor radiation imaging devices comprising a semiconductor detector substrate solder bump-bonded to a semiconductor processing/readout substrate, the occurrence of "cold" solder joints can be a problem. See U.S. Pat. Nos. 5,379,336; 5,812,191; EP 1162833; and EP 0421869. Cold solder joints, also called cold welds, can occur in a variety of solder compositions, including solder alloys containing Indium, Lead, Tin and other metals.

This has motivated the field to seek alternative soldering or bump-bonding methods to reduce the occurrence of cold joints, including a low-temperature bump-bonding techniques (see U.S. Pat. No. 5,952,646). However, current soldering or the above mentioned bump-bonding techniques cannot fulfill all the requirements of new high-density, imaging device assembly processes which utilize temperature sensitive semiconductor materials in the detector substrates. These temperature sensitive semiconductor detector substrates include some of the currently most promising inter-metallic materials, such as Cadmium Telluride (CdTe) compositions and Cadmium Zinc Telluride (CdZnTe) compositions.

When bonding high density semiconductor substrates together with solder, the interconnection volumes are very small in the resulting imaging devices. This small interconnect area coupled with the relatively more brittle character of some of the promising inter-metallic detector substrates can result in a decrease in the mechanical stability of the interconnection and decreased reliability when solder bump-bonding is used with some of these inter-metallic materials. Additionally, the use of metallic Lead (Pb) in solder to bond the semiconductor substrates increases the amount of this toxic metal potentially exposed to the environment.

Therefore, it would be beneficial to the industry to have a semiconductor substrate bonding technique that does not subject the brittle and temperature sensitive inter-metallic semiconductor materials to excessive heat or pressure. Additionally, it would be beneficial to the industry to have an alternative method for producing semiconductor imaging substrates that is simpler than the current bonding techniques, less susceptible to the problem of cold solder joints or cold welds, and which reduces the amount of metallic lead required to accomplish the bonding process.

SUMMARY OF THE INVENTION

The present invention is a digital radiation imaging device and method for producing the device to digitally image radiation in excess of 1 keV. The imaging device is relatively robust, reliable and cost effective. The present radiation imaging device comprises a semiconductor substrate which generates charge directly in response to incoming radiation, a readout/processing semiconductor substrate for processing and reading out the generated charge, and an electrically conductive adhesive means for joining or bonding the two semiconductor substrates together.

The adhesives of the present invention create mechanically solid and electrically conductive contacts of joint between the semiconductor substrates. The cured adhesives are also thermally conductive and protect the electrical contacts from the environment. Most often this is achieved by incorporating electrically conductive or fusible particles into a polymer adhesive.

The adhesives can be either isotropic or anisotropic depending on their physical characteristics and how they are applied to a semiconductor substrate, i.e., in discrete locations or as a film. Isotropic adhesives conduct electricity substantially equally well in all directions, once they are cured in the imaging device. Anisotropic adhesives preferentially conduct electricity well in one plane direction, once they are cured in the imaging device. The mating charge signaling contacts between the semiconductor substrate can be either bumped or bumpless to connect a readout CMOS ASIC substrate to its matching detector substrate. The connections between the mating charge signaling contacts are accomplished using either isotropically conductive or anisotropically conductive adhesives. This is particularly useful with CdTe or CdZnTe detector substrates, but can be used with other radiation imaging detector substrates, including PbI, HgCdTe, GaAs, when the present benefits are desired.

Figure 1:
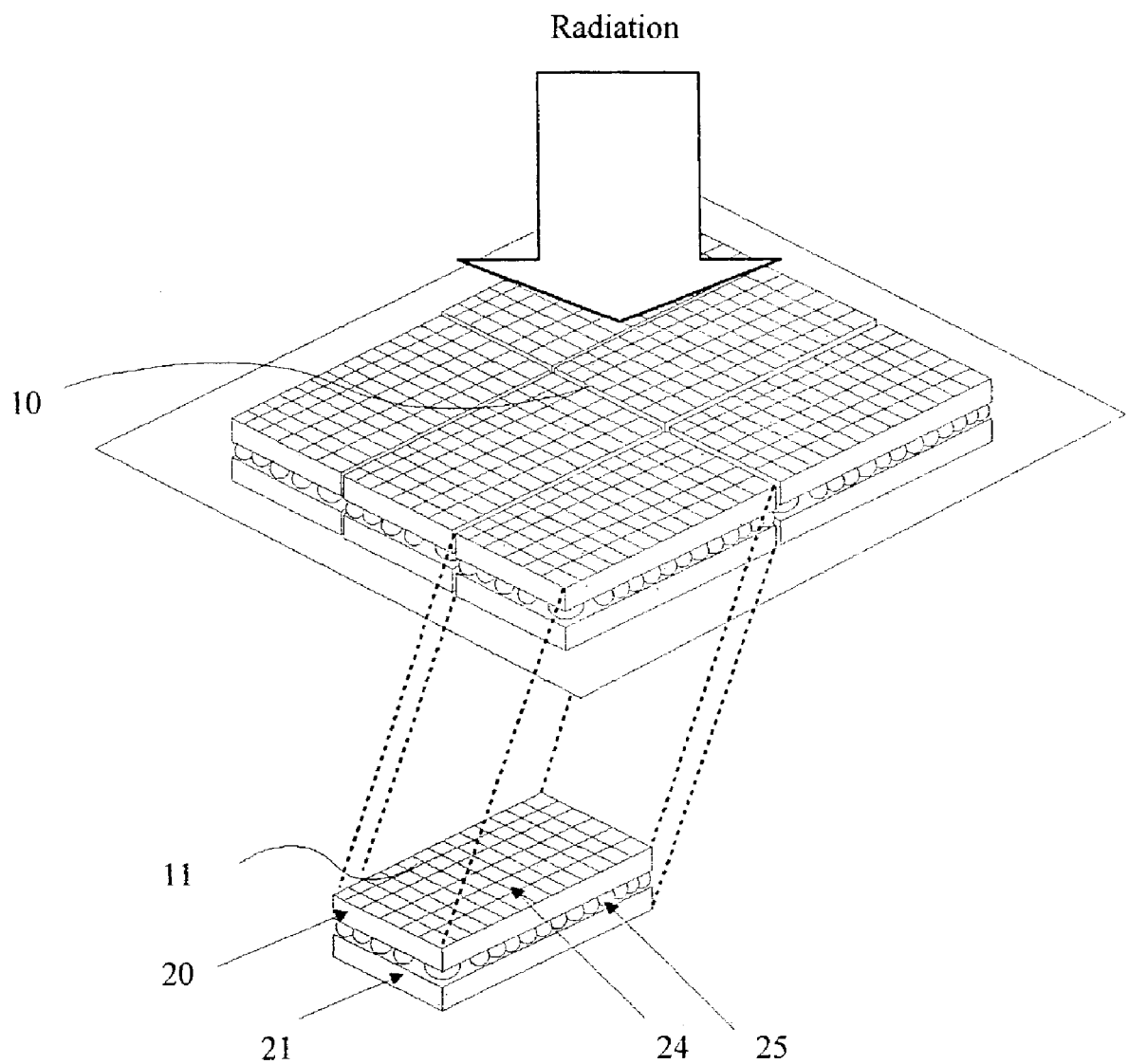
FIG. 1 is an illustration of the device of the present invention comprising the two dimensional imaging array of a radiation imaging system.

FIGURE REFERENCE NUMERALS imaging system 10
imaging device 11
image detector 20
readout CMOS 21
pixel contact (electrode) 22
pixel cell 24
bump 25
additional metal layer 26
isotropically conductive adhesive (ICA) 27
anisotropically conductive adhesive (ACA) 28
continuous electrode 31
semiconductor detector substrate 32
detector insulator 33
under bump metal layers (UBM) 34
CMOS insulator 35
CMOS pixel signal circuit 36
conductor 37
adhesive matrix 38
filler particle 39
detector openings 42
pixel cell pitch P
contact-to-contact gap G

DETAILED DESCRIPTION OF THE INVENTION

In accordance with a preferred embodiment of the present invention the radiation imaging device comprises a semiconductor substrate for generating charge directly in response to incoming radiation hits, a readout/processing semiconductor substrate for processing and reading out the generated charge and an isotropically conductive adhesive (ICA) for bonding the two substrates together. Such ICAs have a conductive filler with a high filler loading rate, and they are conductive substantially in all directions equally well. Only a minimum bonding pressure is required when bonding with ICAs. Hence, the brittle CdTe or CdZnTe detector substrates are not subjected to excessive pressure and the risk of damage to the detector substrate is minimized.

In another preferred embodiment, the imaging device of the present invention comprises a semiconductor substrate for generating charge directly in response to incoming radiation hits, a readout/processing semiconductor substrate for processing and reading out the generated charge and an anisotropically conductive adhesive (ACA) material for bonding the two substrates together. ACAs also have a conductive filler, but achieve electrical conduction by using conductive filler loading rate which provide conduction substantially across a single plane (e.g., z-plane). In anisotropic adhesives, the loading rates are low enough to ensure that electrical insulation is maintained in the other two physical planes (e.g., the x-y-planes) of the bond interface.

The present electrically conductive adhesives comprise a polymer resin, a curing agent, other additives and conductive filler particles. The polymer resin provides a matrix in which the conductive filler particles are suspended. The adhesive matrix can be either thermosetting or thermoplastic. When thermosetting polymer resins are cured, a chemical reaction takes place and a three-dimensional network of cross-linked polymers is formed. As result, thermosetting adhesives are relatively temperature stable and do not melt under heating. They are also essentially infusible, insoluble and show good creep resistance. Epoxy resin is the most frequently used thermosetting adhesive matrix.

On the other hand, thermoplastic adhesives are based on a polymer dispersed in a solvent. Curing of such thermoplastic resins is a drying process, where heating evaporates the solvent content of the resin, thus no chemical reaction takes place. Therefore, the adhesive matrix can be re-melted when subjected to temperatures above a specific melting point or melting range. Hence, thermoplastic adhesives can be used in so called polymer bumps where re-melting is needed. Examples of solvent labile polymers useful in the present invention include polyamides and polyesters.

Conduction mechanisms for providing electrical communication between the semiconductor substrates are highly dependent upon the type of conductive particle that is formulated into the adhesive matrix. The adhesive matrix may be filled with metal, metal alloy or metal coated particles. Examples of metal particles practicable in the practice of the present invention include nickel (Ni), gold (Au) or silver (Ag). In the case of ACAs, the conduction mechanism is based upon applying sufficient pressure during assembly in a such way that the metal particles penetrate through the oxide layer into of the semiconductor substrate, and plastically deform the electrical contact metallizations. On the other hand, in the case of ICAs, the electrical connection between the detector substrate and readout CMOS substrate is created by numerous bridged particles, not by single particles (as in ACAs).

Metal coated particles may, for example, comprise polymer spheres which are coated with Ni/Au or Au. The conduction mechanism in this case is based upon applying sufficient pressure during assembly in a such way that the particles themselves plastically deform and result in overall contact area larger the initial contact area. A benefit of using coated polymer particles filler is that the compressible nature of a single polymer particle (or a cluster of particles) will accommodate some horizontal or vertical movement of the joint area, and hence the electrical connection will remain stable during thermal expansion or other movement. Also, compressibility of the polymer-cores of coated polymer particles fillers can provide the advantage of compensating small non-coplanarity discrepancies between the planes of the readout CMOS ASIC or its bump and pixel contact of the CdTe or CdZnTe detector substrate.

Traditional solder materials, such as tin-lead (SnPb), or low melting point alloys, such as tin-bismuth (SnBi), tinlead-bismuth (SnPbBi), tin-indium (SnIn), are examples of metal alloy particles utilized in electrically conductive adhesives. An adhesive filled with these type of particles creates small, local solder joints or connections between the readout CMOS ASIC's contacts and pixel electrode contacts, while the adhesive matrix simultaneously provides an underfilling. The metallurgical nature of these joints mean that any relaxation of the adhesive matrix, which may occur during the operational lifetime of the particular device, should not affect the electrical continuity of the joints. Also, when the metal filler is metallurgically compatible with the contact metal, a local solder joint is formed even though the melting point of the filler metal or metal alloy is not reached. Bismuth filler with tin contact metal is an example of this technique.

In an alternative embodiment, the filler particles may have a very thin, non-conductive outer surface coating. This very thin insulating coating prevents the particles from creating electrically conductive bridges across the thickness of the adhesive. However, for those filler particles compressed between the bump and pixel electrode contact during bonding of the two substrates together, the non-conductive coating is broken and an electrically conductive pathway is created. The non-conductive coating may be chosen so that breakage of the coating is accomplished or facilitated by heating. Hence, a high particle-adhesive matrix ratio can be used without the risk of short circuiting.

It is not only the choice of filler material, but also the size and shape of the filler particles that influence the properties of the cured adhesive bonds. Some of the properties of the cured adhesive bonds that can be influenced by particle size and shape are: electrical conductivity, thermal conductivity, tensile strength, viscosity, weight loss and rheology. The filler particles may be different configurations as selectable by one of ordinary skill in the art. For example, the filler particles may be flakes, spheres or other shapes, and may have a size ranging from nanometers to several micrometers.

Due to their nature different adhesive types have to be applied to the contact areas accordingly. ICAs have to be applied with high accuracy. For example, screen printing, dispensing or pin-transfer methods can be used. Also, if either the readout CMOS substrate or the detector substrate has bumps, the adhesive can be applied with dipping the CMOS or detector bumps into the ICA. Furthermore, if the adhesive matrix is composed of thermoplastic polymers, the ICA can be cured before actual bonding and a so called polymer bump is formed. This is followed by a normal bump-bonding where the polymer bump re-melts during bonding and an electrical connection is formed. These polymer bumps can also be formed with a masking process, and hence no under bump metals (UMP) or bumps have to be initially deposited on the readout CMOS substrate or the detector substrate. However, additional metal layers may be deposited on top of the conductor in order to improve conductivity and material compatibility (and hence improve reliability). Furthermore, a thermoplastic photoresist mask may be used which, if not removed, can work as an underfill. On the other hand, ACAs can be applied to the whole joining area, not only on each contact or joint area, as ACAs achieve electrical conductivity only in a single plane direction. This greatly reduces the accuracy requirements on whatever method is used to apply the conductive adhesive. Additionally, the conductive adhesive may also be provided as a film which has either randomly or uniformly distributed filler particles in it. This can further decrease the risk of short circuiting due to bridged particles and therefore are often used in very fine pitch applications.

Referring now to the drawings, the details of preferred embodiments of the present invention are graphically and schematically illustrated. Any like elements in the drawings are represented by like numbers, and any similar elements are represented by like numbers with a different lower case letter suffix.

FIG. 1 schematically illustrates an imaging system 10 which consists of one or more imaging devices 11. The imaging device 11 comprises of a readout CMOS substrate 21 and image detector substrate 20 which are bonded together with an electrically conductive adhesive 25. In the preferred embodiment shown, the imaging device II is composed of a plurality of individual pixel cells 24. These pixel cells 24 detect high energy radiation (indicated by the large arrows in figures) and pass the collected information through the readout CMOS 21 to the control electronics for further processing and analysing.

Figure 2A:
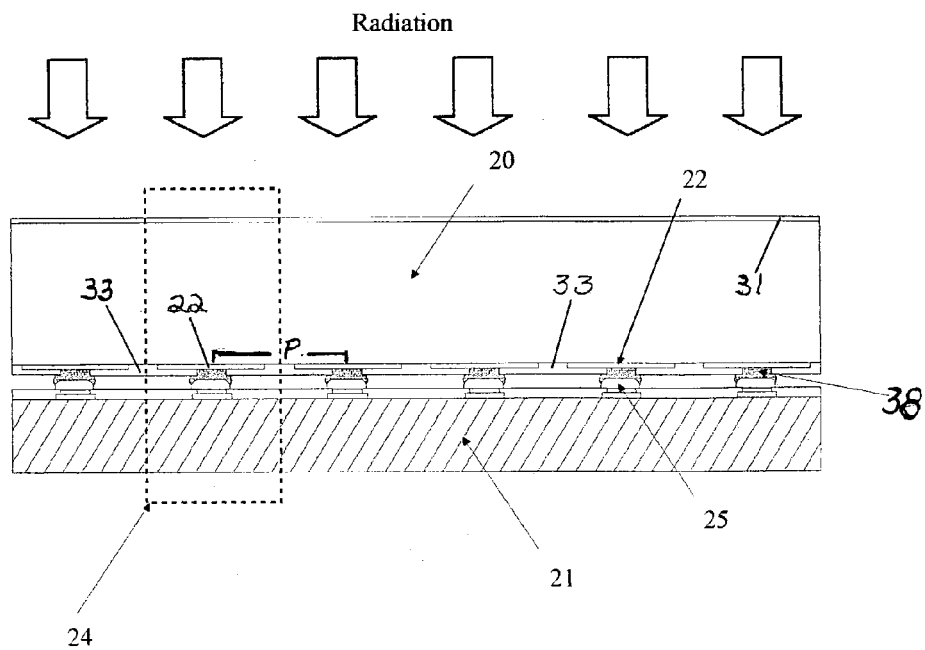
FIG. 2A is a partial cross-sectional side view of an embodiment of the present invention wherein a semiconductor flip-chip substrate is adhesively bonded to a bumped readout CMOS semiconductor substrate using discrete application of an isotropically conductive adhesive.
Figure 2B:
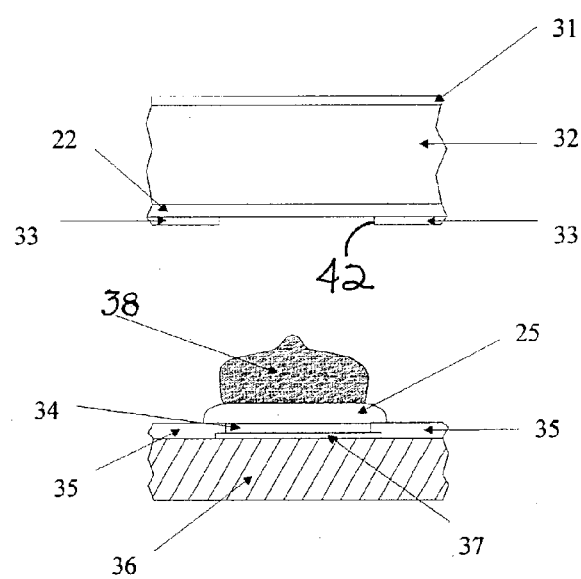
FIG. 2B is an exploded side view of the device of FIG. 2A showing a pixel cell before conductive adhesive bonding of the flip-chip substrate to the bumped CMOS substrate.
Figure 2C:
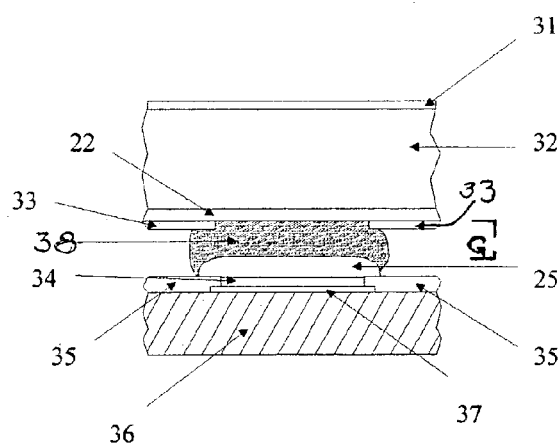
FIG. 2C is an exploded side view of the device of FIG. 2A showing a pixel cell after conductive adhesive bonding of the flip-chip substrate to the bumped CMOS substrate.

FIG. 2A is a schematic cross section of an adhesive bonded imaging device 11. In this example the image detector substrate 20 is bonded to a bumped readout CMOS 21 with a conductive adhesive 38. In the case illustrated either an isotropically conductive adhesive (ICA) 27 or an anisotopically conductive adhesive (ACA) 28 could have been used as the conductive adhesive. FIGS. 2B and 2C are more detailed schematic illustrations of a single pixel cell 24 before (2B) and after bonding (2C). The image detector 20 side of a single pixel cell 24 comprises a semiconductor detector substrate 32 which has a continuous electrode 31 on the back side and pixel contacts (electrodes) 22 on the front side of the detector substrate 32. The pixel contacts 22 are protected with a detector insulation (passivation) layer 33 having small detector openings 42 for electrical connection pathways.

On the readout CMOS ASIC substrate side of the pixel cell 24 is a corresponding CMOS pixel signal circuit 36. This CMOS signal circuit 36 of the pixel cell 24 has a signal contact 37 conductor which is connected (see FIG. 2C) to the pixel contact 22 of the semiconductor detector substrate 32 by means of a conductive adhesive 38. The readout substrate 21 in this example has bumps 25 comprised of, for example, nickel-gold (Ni/Au), nickel-palladium (Ni/Pd), normal solder or a low temperature solder material. Although shown in FIG. 2B as being disposed on the CMOS ASIC readout substrate 21, the bump 25 alternatively may be disposed on the pixel contact 22 of the detector substrate 20 or on the contacts 22 & 37 of both substrates 20 & 21.

As can be seen from FIGS. 2A–C, the conductive adhesive 38 is discretely applied directly on the bump 25. For a conductive adhesive (e.g., an ICA) which is conductive substantially equally in all directions, discrete application directly on a bump 25 or a contact 22 & 37 does not create a signal loss problem from shorting. Application of the conductive adhesive 38 can be done with screen printing, dispensing, pin-transfer methods or other methods known to one of skill in the art. The conductive adhesive 38 itself is a matrix composed of an adhesive or cement (e.g. epoxy adhesive) which is filled with electrically conductive or fusible particles 39 (in FIGS. 4A–4C and FIGS. 5A–5C). These particles 39 can be, for example, metal (e.g. Ag), metal alloy (e.g. Ni/Au) or metal coated particles (e.g. polymer sphere coated with Ni/Au). ICAs consist, in general, of about 35–85 vol-% randomly dispersed filler particles 39, but the filler material, size and amount is determined by the application, the contact materials used, and the pitch P of the pixels and the gap G between the image detector 20 and readout CMOS 21.

Outside the connection area, the CMOS pixel circuit 36 is protected from the environment by the CMOS insulation or passivation 35. In order to improve the compatibility of the materials (in connection with each other) and also to improve adhesion, mechanical and/or electrical conductivity, one or multiple layers of under bump metals (UBM) 34 can be applied between the bump 25 and a pixel circuit signal contact 37. Furthermore, an imaging device bonded with a conductive adhesive 38 can be underfilled if increased reliability is needed.

Figure 3A:
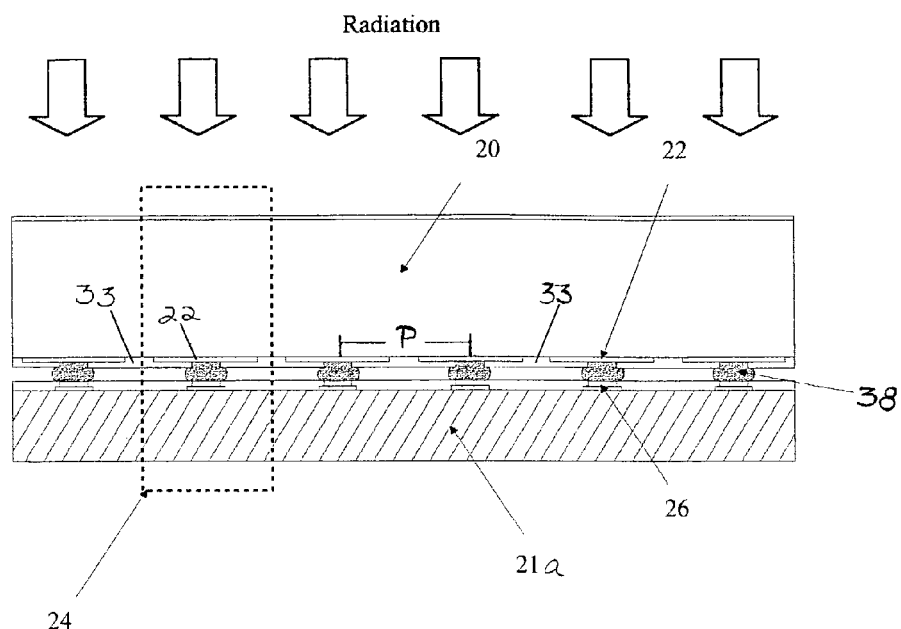
FIG. 3A is a partial cross-sectional side view of an embodiment of the present invention wherein a semiconductor flip-chip substrate is adhesively bonded to a bumpless readout CMOS semiconductor substrate using discrete application of an isotropically conductive adhesive.
Figure 3B:
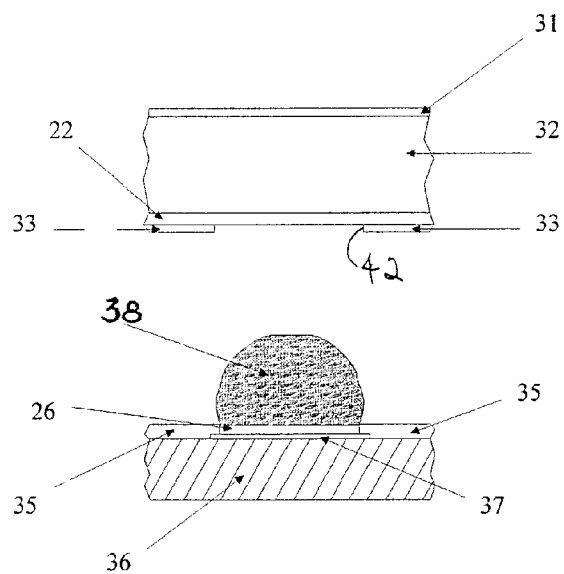
FIG. 3B is an exploded side view of the device of FIG. 3A showing a pixel cell before conductive adhesive bonding of the flip-chip substrate to the bumpless CMOS substrate.
Figure 3C:
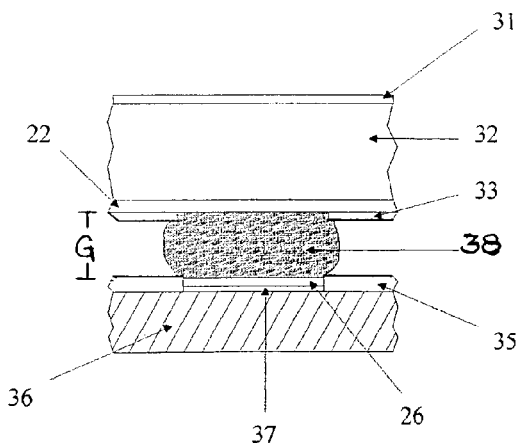
FIG. 3C is an exploded side view of the device of FIG. 3A showing a pixel cell after conductive adhesive bonding of the flip-chip substrate to the bumpless CMOS substrate.
Figure 4A:
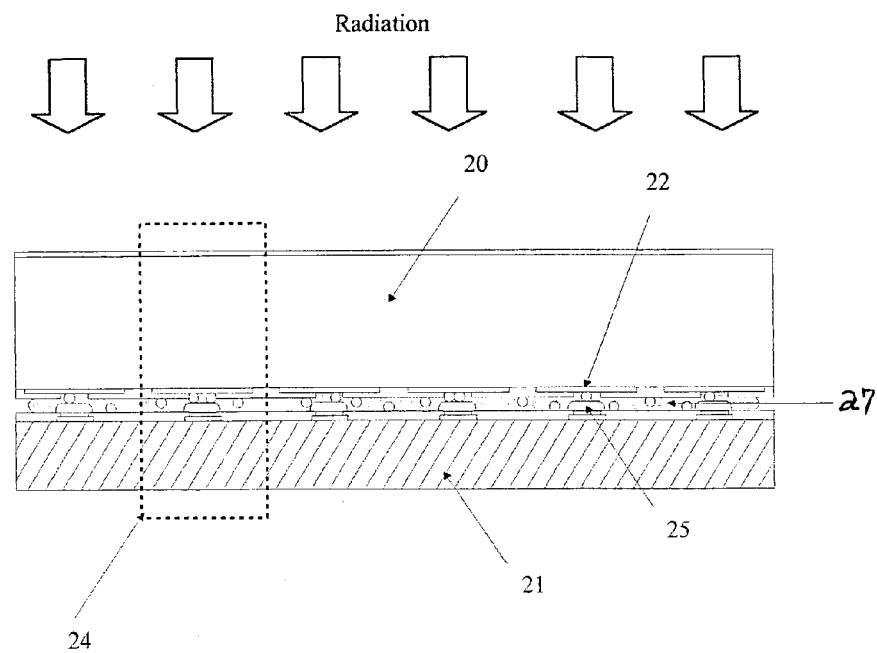
FIG. 4A is a partial cross-sectional side view of an embodiment of the present invention wherein a semiconductor flip-chip substrate is adhesively bonded to a bumped readout CMOS semiconductor substrate using a layer of an anisotropically conductive adhesive, and the directional nature of its conductivity.
Figure 4B:
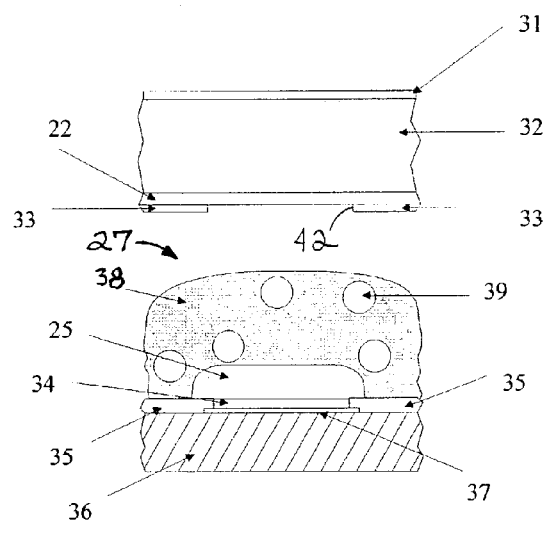
FIG. 4B is an exploded side view of the device of FIG. 4A showing a pixel cell before conductive adhesive bonding of the flip-chip substrate to the bumped CMOS substrate.
Figure 4C:
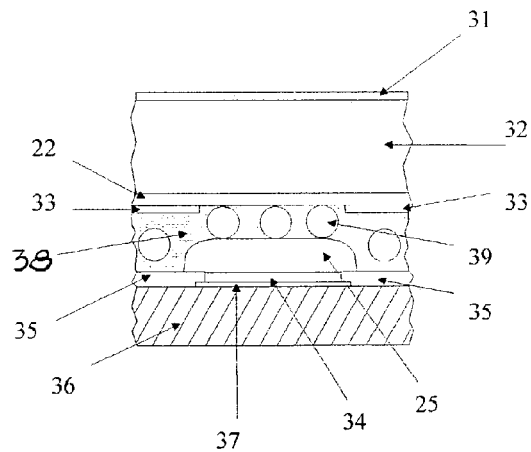
FIG. 4C is an exploded side view of the device of FIG. 4A showing a pixel cell after conductive adhesive bonding of the flip-chip substrate to the bumped CMOS substrate.
Figure 5A:
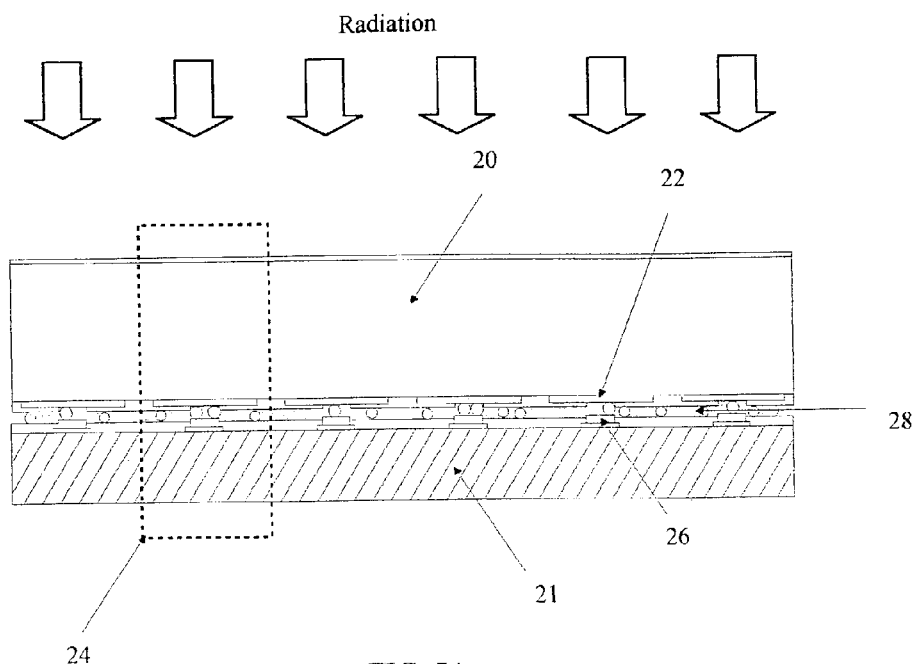
FIG. 5A is a partial cross-sectional side view of an embodiment of the present invention wherein a semiconductor flip-chip substrate is adhesively bonded to a bumpless readout CMOS semiconductor substrate using a layer of an anisotropically conductive adhesive, and the directional nature of its conductivity.
Figure 5B:
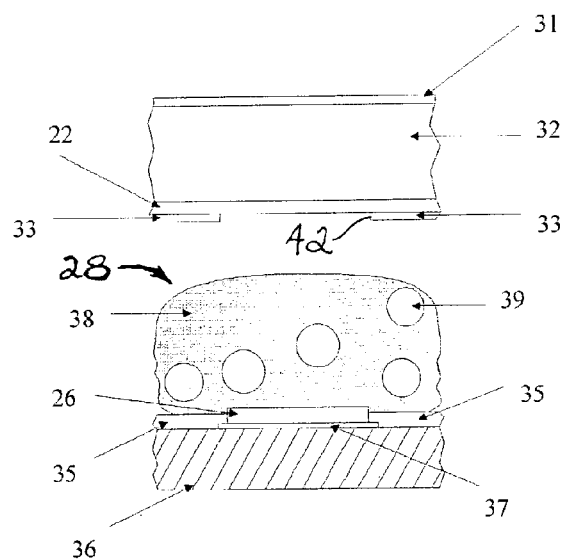
FIG. 5B is an exploded side view of the device of FIG. 5A showing a pixel cell before conductive adhesive bonding of the flip-chip substrate to the bumpless CMOS substrate.
Figure 5C:
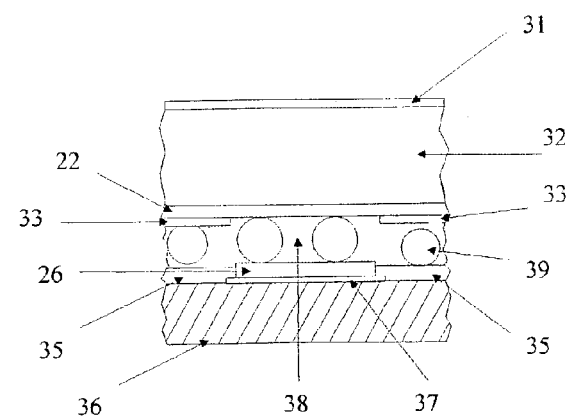
FIG. 5C is an exploded side view of the device of FIG. 5A showing a pixel cell after conductive adhesive bonding of the flip-chip substrate to the bumpless CMOS substrate.

FIG. 3A shows a detector substrate 20 which is bonded to a readout CMOS 21 with a conductive adhesive 38, as in FIGS. 2A–2C. However, unlike in FIGS. 2A–2C, in this example the readout CMOS 21a is bumpless. The bump 25 and UMB 34 may be replaced with additional metal layer 26 in order to improve conductivity and material compatibility (and hence improve reliability), but still no bumping is needed. As FIGS. 3B and 3C illustrate, the bonding process with a bumpless readout CMOS substrate 21a is very similar as it is with a bumped readout CMOS substrate 21.

Generally, the conductive adhesive 38 is not cured before bonding. However, if the adhesive matrix of the conductive adhesive 38 is comprised of thermoplastic polymers, the adhesive may be cured to form a polymer bump before actual bonding of the two semiconductor substrates 20 & 21. This is followed by a normal bump-bonding technique where the polymer bump is remelted during bonding and forms an electrical connection. Polymer bumps can be formed, for example, with a masking process. Alternatively, a photoresist mask may be used as a stencil and the conductive adhesive 38 screen printed onto the signal contacts 37 or pixel contacts 22. This process step may also take place prior to dicing (e.g., of the CMOS chips from the wafer). Furthermore, no additional underfill is needed if the photoresist is also composed of thermoplastic polymers and is not removed from the readout CMOS ASIC substrate 21 or the detector substrate 20.

FIGS. 4A–4C and FIGS. 5A–5C are respectively schematic presentations of a bumped and a bumpless readout CMOS substrate 21, which are bonded to a detector substrate 20 with a conductive adhesive 38. As the figures demonstrate, an ACA 28 (FIG. 5B) contains fewer filler particles than an equivalent volume of an ICA 27 (FIG. 4B), i.e., an ACA 28 has a lower filler loading rate than an ICA 27. An ACA 28 conducts electrical charge only across a single plane (e.g., z-axis) when the filler particles 39 are compressed between, for example, the pixel contact 22 and the bump 25. Moreover, ACAs 28 may be applied to the whole joining surface areas, not only the contact areas. Additionally, an ACA 28 may be configured as a film layer which is placed between the readout CMOS substrate 21 and detector substrate 20. The adhesive film may consist of one or multiple layers which all may have different properties according to the application. Furthermore, the conductive filler particles 39 may be either randomly or uniformly distributed in the film.

While the above description contains many specifics, these should not be construed as limitations on the scope of the invention, but rather as exemplifications of one or another preferred embodiment thereof Many other variations are possible, which would be obvious to one skilled in the art. Accordingly, the scope of the invention should be determined by the scope of the appended claims and their equivalents, and not just by the embodiments.

What is claimed is:

1. An x-ray and gamma-ray radiation energy imaging device comprising:
    a detector substrate, the detector substrate having an electrode surface and a pixel surface, and disposed to convert said radiation energy impinging on the electrode surface to electrical charges, and with the pixel surface having a plurality of pixels and associated pixel contacts thereon with the pixels for collecting the electrical charges and the pixel contacts disposed in a pixel contact pattern;
    an CMOS ASIC readout substrate having a readout surface disposed opposite the pixel surface of the detector substrate, a plurality of pixel signal circuits disposed on the readout surface and the signal circuits each having a signal contact processed on the readout surface in a signal contact pattern, the signal contacts being inputs to the signal circuits of the CMOS ASIC readout substrate; and
    a plurality of electrically conductive bonds each discretely connecting a pixel contact in the pixel pattern to a signal contact in the signal contact pattern, the bonds consisting essentially of an electrically conductive adhesive, with substantially each bond having a space empty of conductive adhesive separating it from adjacent bonds.

2. The radiation energy imaging device of claim 1, wherein the detector substrate comprises an element selected from the group consisting of Cadmium and Tellurium.

3. The radiation energy imaging device of claim 1, wherein the electrically conductive bonds comprise bump-bonds.

4. The radiation energy imaging device of claim 1, wherein the electrically conductive bonds comprise an isotropically conductive adhesive.

5. The x-ray and gamma-ray radiation energy imaging device of claim 1, wherein the conductive adhesive contains conductive filler particles, the conductive filler particles being uncoated.

6. The x-ray and gamma-ray radiation energy imaging device of claim 1, wherein the conductive adhesive contains conductive filler particles, the conductive filler particles having a size ranging from nanometers to a micrometer.

7. A method of producing an x-ray and gamma-ray radiation energy imaging device of claim 1 comprising the steps of:
    providing a semiconductor detector substrate and an CMOS ASIC semiconductor readout substrate, the detector substrate having an electrode surface and a pixel surface, and disposed to convert said radiation energy impinging on the electrode surface to electrical charges, and with the pixel surface having a plurality of pixels and associated pixel contacts thereon with the pixels for collecting the electrical charges and the pixel contacts disposed in a pixel contact pattern, and the CMOS ASIC readout substrate having a readout surface with a plurality of pixel signal circuits disposed on the readout surface and the signal circuits each having a signal contact processed on the readout surface in a signal contact pattern corresponding to the pixel contact pattern, the signal contacts being inputs to the signal circuits of the CMOS ASIC readout substrate;
    applying a conductive adhesive discretely to each contact of at least one of a set of contacts selected from the group consisting of the pixel contacts and the signal contacts;

juxtapositioning the pixel surface of the semiconductor detector substrate with the readout surface of the semiconductor readout substrate, with the pixel contacts closely proximate corresponding signal contacts on the semiconductor readout substrate; and causing the conductive adhesive of the conductive adhesive coated contacts under appropriate conditions of heat and pressure to conductively adhere the pixel contacts of the detector substrate to the corresponding signal contacts on the semiconductor readout substrate with substantially each bond having a space empty of conductive adhesive separating it from adjacent bonds to produce the radiation energy imaging device of claim 1.

8. A method of producing a radiation energy imaging device of claim 7, wherein the applying step comprises: applying a conductive adhesive to at least one of substrate surfaces selected from the group consisting of the semiconductor detector surface and the semiconductor readout surface to provide a conductive adhesive coated semiconductor substrate face with conductive adhesive coated contacts.

9. The method of producing a radiation energy imaging device of claim 7, wherein the conductive adhesive is an isotropically conductive adhesive.

* * * * *

UNITED STATES PATENT AND TRADEMARK OFFICE
CERTIFICATE OF CORRECTION

PATENT NO.        : 7,170,062 B2
APPLICATION NO.   : 10/400381
DATED             : January 30, 2007
INVENTOR(S)       : Mikko Iimari Vuorela Page 1 of 1

It is certified that error appears in the above-identified patent and that said Letters Patent is hereby corrected as shown below:

In Col. 6, line 12, replace the phrase "the imaging device II" with --the imaging device 11--.

In Col. 8, line 12, replace the phrase "an CMOS ASIC readout" with --a CMOS ASIC readout--.

In Col. 8, line 47, replace the phrase "and an CMOS ASIC semiconductor" with --and a CMOS ASIC semiconductor--.

Signed and Sealed this

Twenty-fourth Day of April, 2007

JON W. DUDAS
*Director of the United States Patent and Trademark Office*